United States Patent
Ahn et al.

(10) Patent No.: US 8,482,331 B2
(45) Date of Patent: Jul. 9, 2013

(54) OPEN LOOP TYPE DELAY LOCKED LOOP AND METHOD FOR OPERATING THE SAME

(75) Inventors: Seung-Joon Ahn, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 178 days.

(21) Appl. No.: 12/832,549

(22) Filed: Jul. 8, 2010

(65) Prior Publication Data

US 2011/0291730 A1    Dec. 1, 2011

(30) Foreign Application Priority Data

May 27, 2010    (KR) .......................... 10-2010-0049618

(51) Int. Cl.
*H03H 11/26*    (2006.01)
(52) U.S. Cl.
USPC .......................................... 327/277; 327/278
(58) Field of Classification Search
USPC ................................................ 327/276–278
See application file for complete search history.

(56) References Cited

U.S. PATENT DOCUMENTS

| 7,109,766 B2 * | 9/2006 | White et al. | 327/158 |
| 7,391,247 B2 * | 6/2008 | Millar | 327/158 |
| 8,143,925 B2 * | 3/2012 | Ahn et al. | 327/158 |
| 8,193,846 B2 * | 6/2012 | Fagan et al. | 327/276 |

FOREIGN PATENT DOCUMENTS

| KR | 1020030002131 | 1/2003 |
| KR | 1020070054455 | 5/2007 |
| KR | 1020090117118 | 11/2009 |
| KR | 1020100053045 | 5/2010 |

* cited by examiner

*Primary Examiner* — Hai L Nguyen
(74) *Attorney, Agent, or Firm* — IP & T Group LLP

(57) ABSTRACT

An open loop type delay locked loop includes a delay amount pulse generation unit configured to generate a delay amount pulse having a pulse width corresponding to a delay amount for delay locking a clock signal, a delay amount coding unit configured to output a code value by coding the delay amount in response to the delay amount pulse, a clock control unit configured to adjust a toggling period of the clock signal in response to a control signal, and a delay line configured to delay an adjusted clock signal outputted from the clock control unit in response to the code value.

16 Claims, 7 Drawing Sheets

217A

217B ary embodiments of the present invention relate to
OPEN LOOP TYPE DELAY LOCKED LOOP AND METHOD FOR OPERATING THE SAME

CROSS-REFERENCE TO RELATED APPLICATIONS

The present application claims priority of Korean Patent Application No. 10-2010-0049618, filed on May 27, 2010, which is incorporated herein by reference in its entirety.

BACKGROUND OF THE INVENTION

Exemplary embodiments of the present invention relate to a semiconductor design technology, and more particularly, to an open loop type of a delay locked loop and a method for operating the same.

In general, a semiconductor integrated circuit has been continuously improved to increase an operating speed as well as an integration density. To increase the operating speed of the semiconductor integrated circuit, a synchronous semiconductor integrated circuit designed to operate in synchronization with a source clock provided from the outside of the semiconductor integrated circuit has been developed. Such a synchronous semiconductor integrated circuit employs a closed loop type of a delay locked loop (DLL) which generates an internal clock by delaying a source clock by a certain delay time in order to output data accurately in synchronization with rising and falling edges of the source clock.

The DLL generates an internal clock by compensating a source clock for a delay component inside a semiconductor integrated circuit. This is called a locking operation.

FIG. 1 is a block diagram of a conventional DLL.

Referring to FIG. 1, the conventional DLL 100 includes an input buffer unit 110, a delay line 120, a replica delay 130, a phase comparison unit 140, a delay control unit 150, and an output buffer unit 160. The input buffer unit 110 is configured to buffer a source clock EX_CLK and output an internal clock IN_CLK. The delay line 120 is configured to output an operation clock IN_CLK' by delaying the internal clock IN_CLK outputted from the input buffer unit 110 in response to a control signal CTR. A replica delay 130 outputs a feedback clock FD_CLK by reflecting/applying a modeled delay amount in/to the operation clock IN_CLK' outputted from the delay line 120. The modeled delay amount is a delay amount which actually occurs in an input/output data path of the DLL 100. The phase comparison unit 140 is configured to compare a phase of the internal clock IN_CLK outputted from the input buffer unit 110 with a phase of the feedback clock FD_CLK outputted from the replica delay 130. The delay control unit 150 is configured to generate the control signal CTR in response to an output signal of the phase comparison unit 140, and output the control signal CTR to the delay line 120. The output buffer unit 160 is configured to buffer the operation clock IN_CLK' of the delay line 120 and output a final output signal DLL_CLK. As shown in FIG. 1, the DLL 100 is configured as a closed loop type DLL.

Hereinafter, the operation of the DLL 100 of FIG. 1 is described.

When the source clock EX_CLK is buffered through the input buffer unit 110 and transferred to the delay line 120 as the internal clock IN_CLK, the delay line 120 initially bypasses the internal clock IN_CLK.

In such a state, the operation clock IN_CLK' of the delay line 120 is fed back to the replica delay 130. The replica delay 130 outputs the feedback clock FD_CLK by delaying the operation clock IN_CLK' by a delay time corresponding to a modeled delay amount.

The phase comparison unit 140 compares the phase of the internal clock IN_CLK outputted from the input buffer unit 110 with the phase of the feedback clock FD_CLK outputted from the replica delay 130. The delay control unit 150 generates the control signal CTR in response to the output signal of the phase comparison unit 140 and outputs the control signal CTR to the delay line 120.

The delay line 120 outputs the operation clock IN_CLK' by delaying the internal clock IN_CLK by the corresponding delay time in response to the control signal CTR.

The above-described operations are repeated, and the delay amount of the delay line 120 is locked when the phase of the internal clock IN_CLK is synchronized with the phase of the feedback clock FD_CLK.

Meanwhile, after the delay amount for the delay locking of the delay line 120 is determined, an update operation is performed according to a certain cycle. Jitter factors may be generated in the locked operation clock IN_CLK' due to noises or the like. To compensate the operation clock IN_CLK', the above-described delay locking operation is repetitively performed in the update operation.

However, the conventional DLL 100 may have the following concerns.

As described above, since the DLL 100 is to perform the feedback operation several times until the delay locking is achieved, a delay locking time may be lengthened. Furthermore, the long delay locking time increases current consumption.

SUMMARY OF THE INVENTION

Exemplary embodiments of the present invention are directed to an open loop type DLL which is capable of reducing a delay locking time, thereby improving an operating speed and reducing current consumption.

In accordance with an exemplary embodiment of the present invention, an open loop type delay locked loop includes a delay amount pulse generation unit configured to generate a delay amount pulse having a pulse width corresponding to a delay amount for delay locking a clock signal, a delay amount coding unit configured to output a code value by coding the delay amount in response to the delay amount pulse, a clock control unit configured to adjust a toggling period of the clock signal in response to a control signal, and a delay line configured to delay an adjusted clock signal outputted from the clock control unit in response to the code value.

In accordance with another exemplary embodiment of the present invention, an open loop type delay locked loop includes a replica delay oscillator section configured to generate a replica oscillation signal having a period corresponding to a replica delay in response to a reset signal, a clock transfer section configured to receive a clock signal and output the received clock signal in response to the reset signal, a pulse generation section configured to generate a delay amount pulse having a pulse width corresponding to a delay amount for delay locking the clock signal in response to the replica oscillation signal and an output of the clock transfer section, a delay amount coding unit configured to output a code value by coding the delay amount in response to the delay amount pulse, a clock toggling control unit configured to generate a toggling control signal for setting a toggling period of the clock signal in response to a control signal, an output unit configured to adjust the toggling period of the clock signal to a certain period in response to the toggling control signal and output a period limit clock, and a delay line configured to delay the period limit clock in response to the code value.

In accordance with yet another exemplary embodiment of the present invention, a method for operating an open loop type delay locked loop includes generating a delay amount pulse having a pulse width corresponding to a delay amount for delay locking a clock signal, coding the delay amount to output a code value in response to the delay amount pulse, dividing the period of the clock signal by a certain number in response to a first control signal to generate a second control signal, generating a third control signal activated in synchronization with the clock signal depending on the first control signal and deactivated in synchronization with the clock signal depending on the second control signal, adjusting a toggling period of the clock signal in response to the third control signal to output an adjusted clock signal, and delaying the adjusted clock signal by the delay amount in response to the code value.

DESCRIPTION OF SPECIFIC EMBODIMENTS

Figure 1:
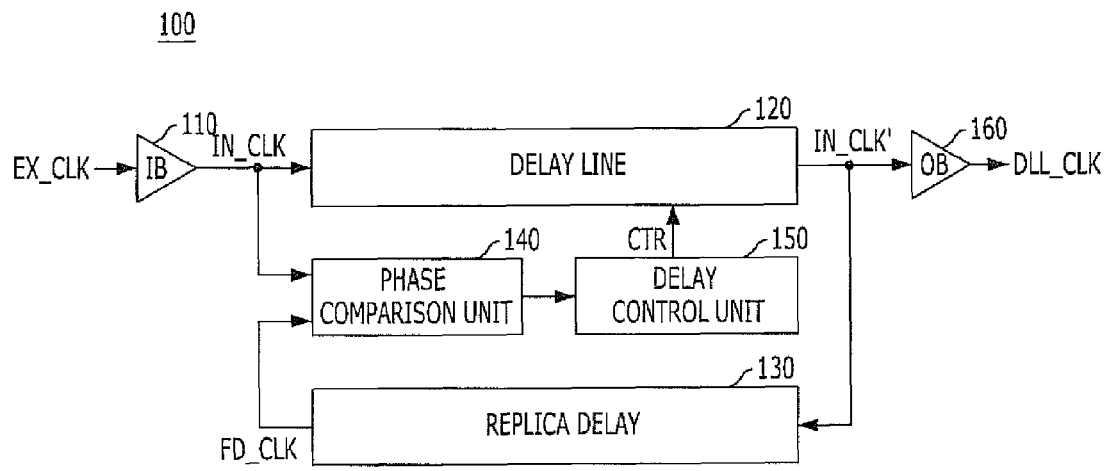
FIG. 1 is a block diagram of a conventional DLL.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
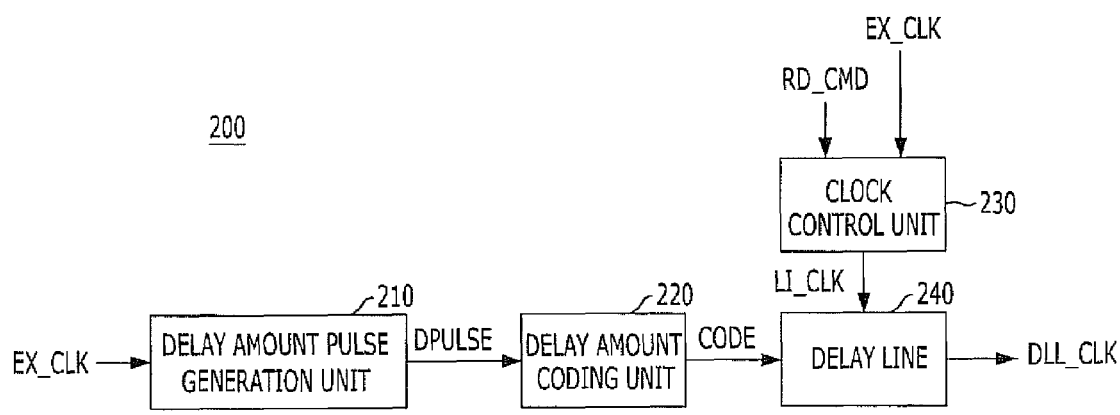
FIG. 2 is a block diagram of a DLL in accordance with an embodiment of the present invention.

FIG. 2 is a block diagram of an open loop type DLL in accordance with an exemplary embodiment of the present invention.

Referring to FIG. 2, the DLL 200 includes a delay amount pulse generation unit 210, a delay amount coding unit 220, a clock control unit 230, and a delay line 240. The delay amount pulse generation unit 210 is configured to generate a delay amount pulse DPULSE having a pulse width corresponding to a delay amount for delay locking a source clock EX_CLK. The delay amount coding unit 220 is configured to measure the pulse width of the delay amount pulse DPULSE and output a code value CODE by coding the delay amount for the delay locking. The clock control unit 230 is configured to limit a toggling period of the source clock EX_CLK to a certain period in response to a read command signal RD_CMD. The delay line 240 is configured to delay an output signal LI_CLK of the clock control unit 230 in response to the code value CODE outputted from the delay amount coding unit 220. For reference, the source clock EX_CLK may be a clock signal which is inputted from the outside and continuously toggled.

Figure 3:
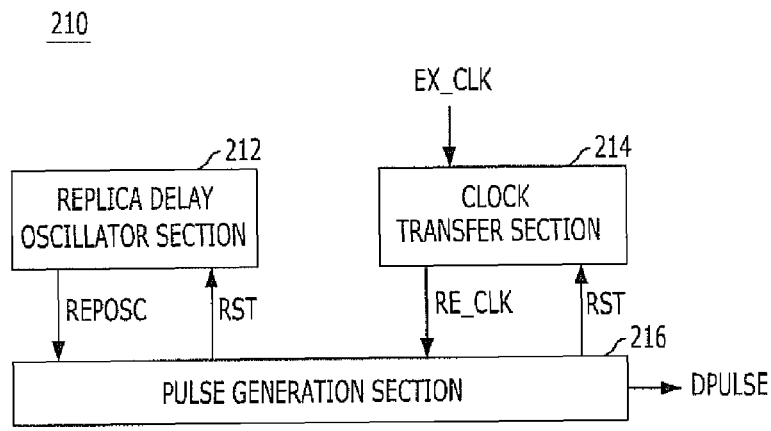
FIG. 3 is a block diagram of a delay amount pulse generation unit of FIG. 2.

FIG. 3 is a block diagram of the delay amount pulse generation unit 210 of FIG. 2.

Referring to FIG. 3, the delay amount pulse generation unit 210 includes a replica delay oscillator section 212, a clock transfer section 214, and a pulse generation section 216. The replica delay oscillator section 212 is configured to output a replica oscillation signal REPOSC having a pulse width corresponding to a modeled delay amount in response to a reset signal RST. The modeled delay amount is a delay amount which actually occurs in an input/output data path of the DLL 200. The clock transfer section 214 is configured to output the source clock EX_CLK as a reset clock RE_CLK in response to the reset signal RST. The pulse generation section 216 is configured to receive the replica oscillation signal REPOSC and the reset clock RE_CLK, and output the delay amount pulse DPULSE having a pulse width corresponding to the delay amount for the delay locking operation. Meanwhile, the pulse generation section 216 may also generate the reset signal RST.

Figure 4:
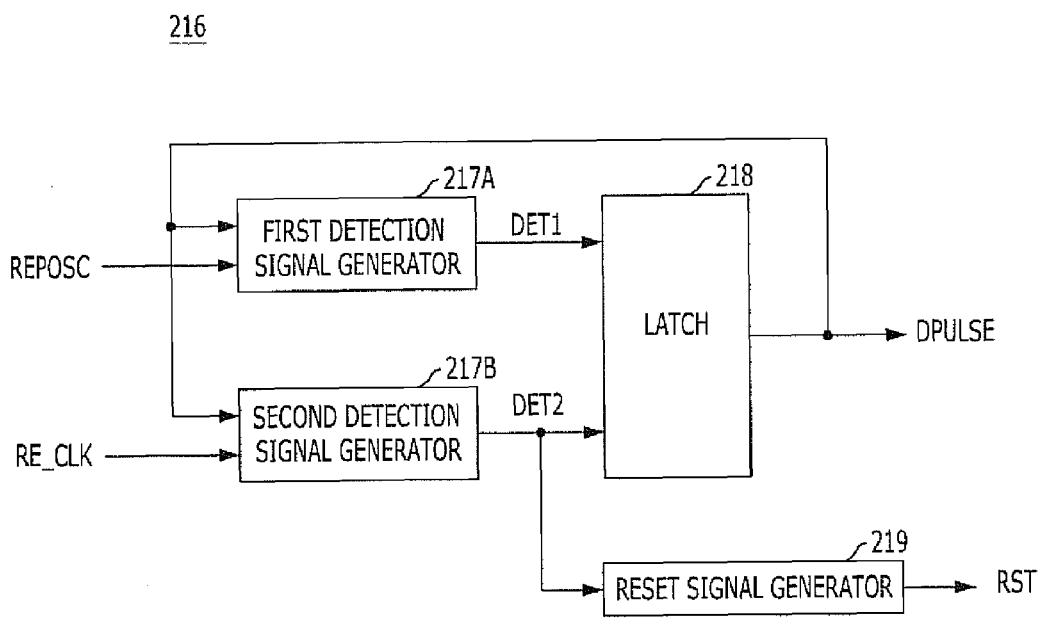
FIG. 4 is a block diagram of the pulse generation section of FIG. 3.

FIG. 4 is a block diagram of the pulse generation section 216 of FIG. 3.

Referring to FIG. 4, the pulse generation section 216 includes a first detection signal generator 217A, a second detection signal generator 217B, a latch 218, and a reset signal generator 219. The first detection signal generator 217A is configured to generate a first detection signal DET1 which is activated in synchronization with a falling edge of the replica oscillation signal REPOSC. The second detection signal generator 217B is configured to generate a second detection signal DET2 which is activated in synchronization with a rising edge of the reset clock signal RE_CLK after the generation of the first detection signal DET1. The latch 218 is configured to receive the first detection signal DET1 and the second detection signal DET2 and output the delay amount pulse DPULSE which is activated at the activation timing of the first detection signal DET1 and is deactivated at the activation timing of the second detection signal DET2. The reset signal generator 219 is configured to output the reset signal RST by delaying the second detection signal DET2 by a certain time.

Figure 5A:
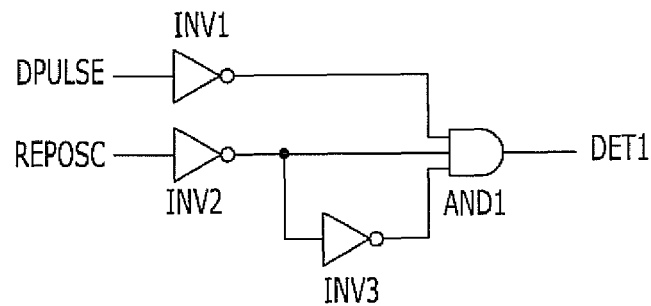
FIG. 5A is a circuit diagram of a first detection signal generator of FIG. 4.
Figure 5B:
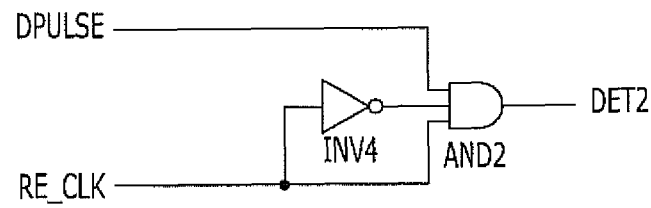
FIG. 5B is a circuit diagram of a second detection signal generator of FIG. 4.

FIG. 5A is a circuit diagram of the first detection signal generator 217A of FIG. 4, and FIG. 5B is a circuit diagram of the second detection signal generator 217B of FIG. 4.

As illustrated in FIG. 5A, the first detection signal generator 217A includes a first inverter INV1 configured to invert the delay amount pulse DPULSE, a second inverter INV2 configured to invert the replica oscillation signal REPOSC, a third inverter INV3 configured to invert an output signal of the second inverter INV2, and a first AND gate AND1 configured to perform an AND operation on the output signals of the first inverter INV1, the second inverter INV2, and the third inverter INV3 and output the first detection signal DET1.

As illustrated in FIG. 5B, the second detection signal generator 217B includes a fourth inverter INV4 configured to invert the reset clock RE_CLK, and a second AND gate AND2 configured to perform an AND operation on the delay amount pulse DPULSE, the reset clock RE_CLK, and an output signal of the fourth inverter INV4 and output the second detection signal DET2.

Although not illustrated, the latch 218 may be implemented using an RS flip-flop. In this case, the first detection signal DET1 is inputted to a set terminal, the second detection signal DET2 is inputted to a reset terminal, and the delay amount pulse DPULSE is outputted through an output terminal.

Figure 6:
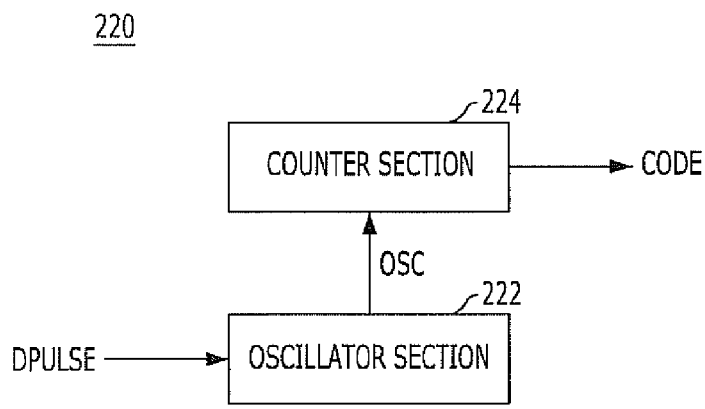
FIG. 6 is a block diagram of a delay amount coding unit of FIG. 2.

FIG. 6 is a block diagram of the delay amount coding unit 220 of FIG. 2.

Referring to FIG. 6, the delay amount coding unit 220 includes an oscillator section 222 and a counter section 224. The oscillator section 222 is configured to generate an oscillation signal OSC in response to the delay amount pulse DPULSE. The counter section 224 is configured to count the number of oscillations of the oscillation signal OSC and output the code value CODE by coding the count value.

Figure 7:
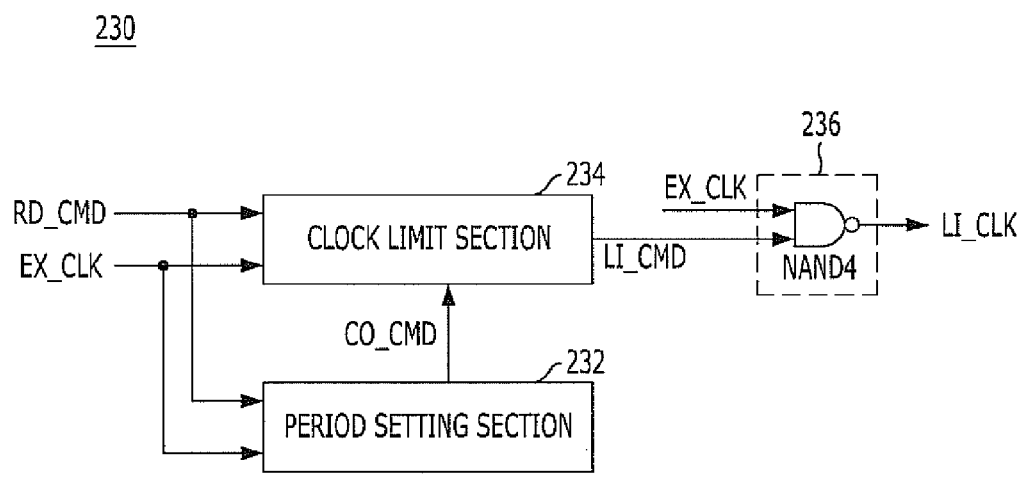
FIG. 7 is a block diagram of a clock control unit of FIG. 2.

FIG. 7 is a block diagram of the clock control unit 230 of FIG. 2.

Referring to FIG. 7, the clock control unit 230 includes a period setting section 232, a clock limit section 234, and an output section 236. The period setting section 232 is configured to generate a period setting signal CO_CMD for setting a toggling period of the source clock EX_CLK in response to the read command signal RD_CMD. The clock limit section 234 is configured to receive the read command signal RD_CMD, the source clock EX_CLK, and the period setting signal CO_CMD and generate a toggling limit signal LI_CMD. The output section 236 is configured to generate a period limit clock LI_CLK in response to the toggling limit signal LI_CMD. The period limit clock LI_CLK is generated by limiting the toggling period of the source clock EX_CLK to a certain period.

Figure 8A:
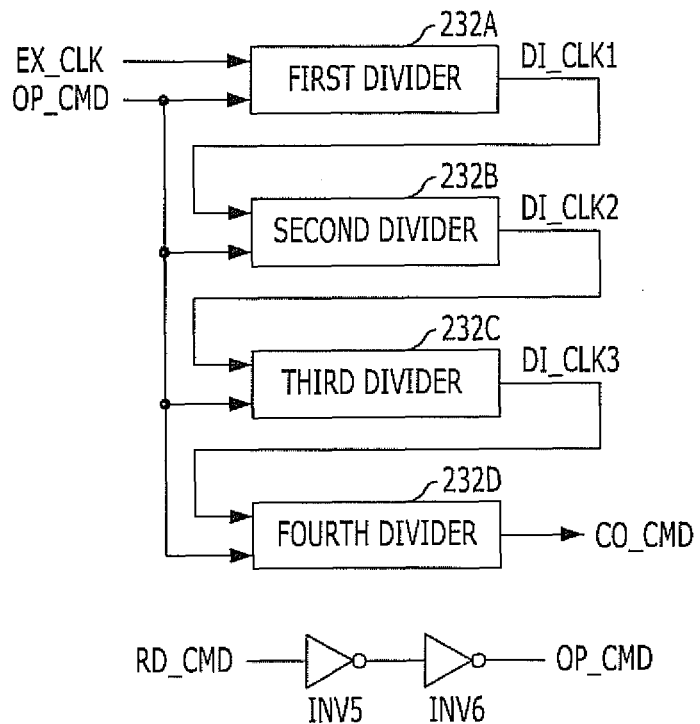
FIG. 8A is a block diagram of a period setting section of FIG. 7.
Figure 8B:
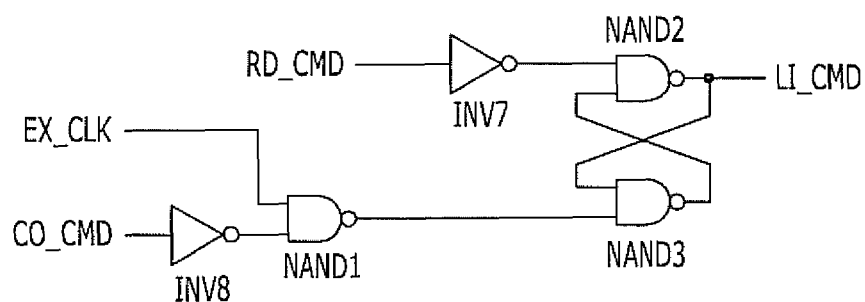
FIG. 8B is a circuit diagram of a clock limit section of FIG. 7.

FIG. 8A is a block diagram of the period setting section 232 of FIG. 7, and FIG. 8B is a circuit diagram of the clock limit section 234 of FIG. 7.

As illustrated in FIG. 8A, the period setting section 232 includes a first divider 232A, a second divider 232B, a third divider 232C, and a fourth divider 232D. The first divider 232A is configured to divide the source clock EX_CLK in response to an operation control signal OP_CMD derived from the read command signal RD_CMD. The second divider 232B is configured to divide an output signal DI_CLK1 of the first divider 232A in response to the operation control signal OP_CMD. The third divider 232C is configured to divide an output signal DI_CLK2 of the second divider 232B in response to the operation control signal OP_CMD. The fourth divider 232D is configured to divide an output signal DI_CLK3 of the third divider 232C in response to the operation control signal OP_CMD. The output signal of the fourth divider 232D may be outputted as the period setting signal CO_CMD. Here, for example, the period setting signal CO_CMD may be the result of dividing a period of the source clock EX_CLK by sixteen. Although it is described above that the first to fourth dividers 232A to 232D are provided in order to divide the period of the source clock EX_CLK by sixteen, the invention is not limited thereto. The number of times the period of the source clock EX_CLK is divided may be determined by providing various numbers of dividers depending on demands. For example, in the case of DDR3, when a burst length is 8, 4 clock cycles (4 tCK) are needed and when a CAS latency is 15, 15 clock cycles (15 tCK) are needed. Therefore, in this case, a total time of at least 19 cycles of the source clock EX_CLK (19 tCK) is to be secured. Therefore, the period setting signal CO_CMD may be activated for 32 cycles of the source clock EX_CLK (i.e., 32 tCk). In this case, six dividers (2^6=64) are demanded. The period setting section 232 divides the period of the source clock EX_CLK by sixty four and outputs the period setting signal CO_CMD. Meanwhile, the operation control signal OP_CMD is a signal generated by passing the read command signal RD_CMD through fifth and sixth inverters INV5 and INV6.

As illustrated in FIG. 8B, the clock limit section 234 includes a seventh inverter INV7, an eighth inverter INV8, a first NAND gate NAND1, and a latch implemented with second and third NAND gates NAND2 and NAND3. The seventh inverter INV7 is configured to invert the read command signal RD_CMD, and the eighth inverter INV8 is configured to invert the period setting signal CO_CMD. The first NAND gate NAND1 is configured to perform a NAND operation on an output signal of the eighth inverter INV8 and the source clock EX_CLK. The latch is configured to activate the toggling limit signal LI_CMD in response to an output signal of the seventh inverter INV7 and deactivate the toggling limit signal LI_CMD in response to an output signal of the first NAND gate NAND1.

Meanwhile, the output section 236 of the clock control unit 230 includes a fourth NAND gate NAND4 configured to perform a NAND operation on the source clock EX_CLK and the toggling limit signal LI_CMD. The output section 236 outputs the source clock EX_CLK during the activation period of the toggling limit signal LI_CMD. In other words, the output section 236 outputs the source clock EX_CLK as the period limit clock LI_CLK.

Referring to FIG. 2, the delay line 240 is configured to output a final internal clock DLL_CLK of the DLL 200 by delaying the period limit clock LI_CLK supplied by the clock control unit 230 in response to the code value CODE supplied by the delay amount coding unit 220. The delay line 240 receives the period limit clock LI_CLK, which toggles only during the period determined by the clock control unit 230, instead of the source clock EX_CLK, which toggles continuously. Therefore, current consumption of the delay line 240 may be reduced.

The operation of the DLL 200 configured as described above is described with reference to FIGS. 9 to 11.

Figure 9:
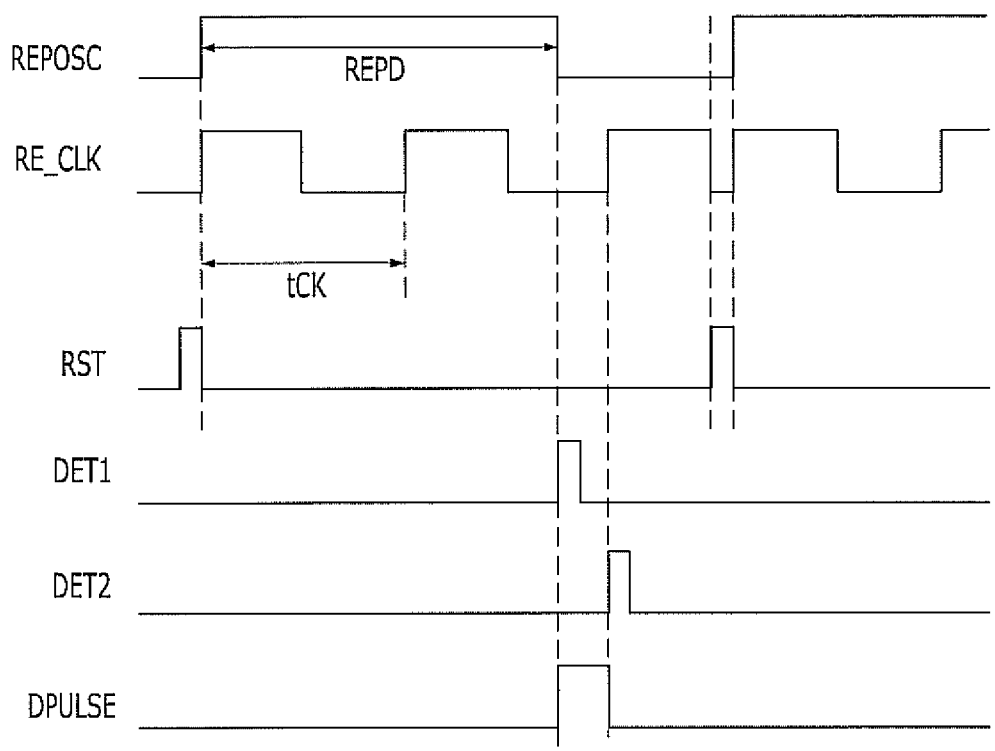
FIG. 9 is a timing diagram illustrating the operation of the delay amount pulse generation unit of FIG. 2.
Figure 10:
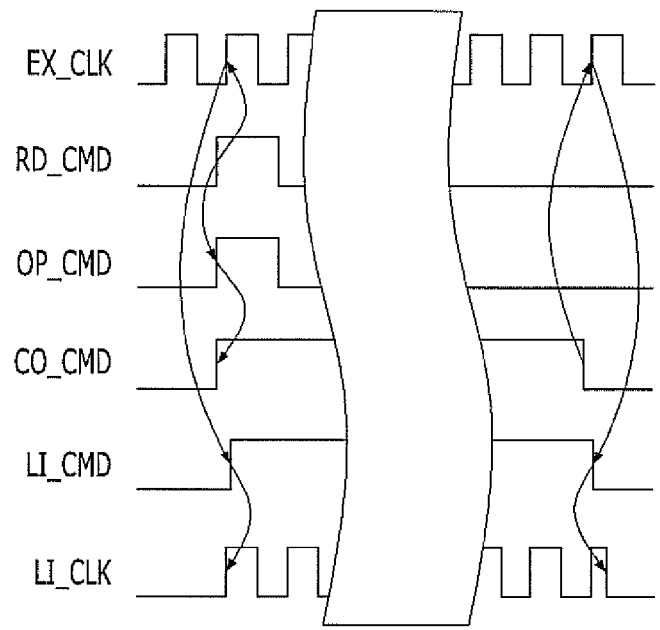
FIG. 10 is a timing diagram illustrating the operation of the clock control unit of FIG. 2.
Figure 11:
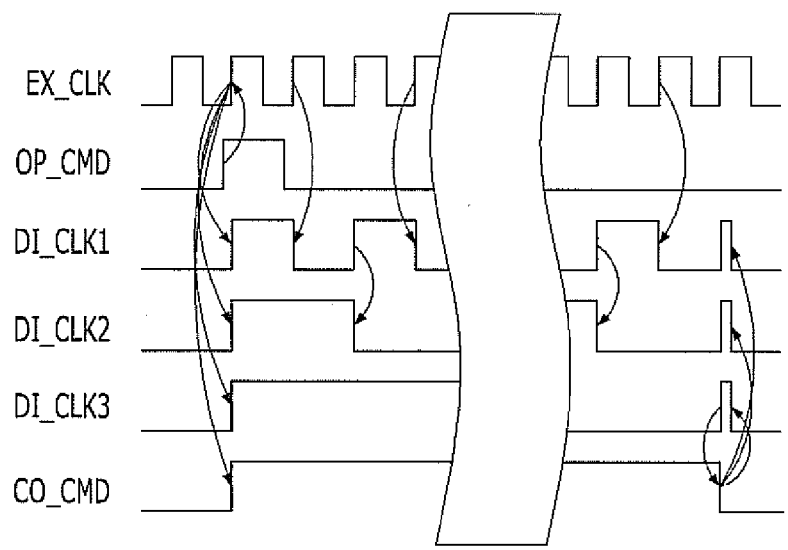
FIG. 11 is a timing diagram illustrating the operation of the period setting section of FIG. 7.

FIG. 9 is a timing diagram illustrating the operation of the delay amount pulse generation unit 210 of FIG. 2. FIG. 10 is a timing diagram illustrating the operation of the clock control unit 230 of FIG. 2. FIG. 11 is a timing diagram illustrating the operation of the period setting section 232 of FIG. 7, which is included in the clock control unit 230 of FIG. 2.

Referring to FIG. 9, the replica delay oscillator section 212 outputs the replica oscillation signal REPOSC having a pulse width REPD corresponding to the modeled delay amount in response to the reset signal RST. The modeled delay amount is a delay amount which actually occurs in an input/output data path of the DLL 200. In this case, the delay amount for the delay locking of the DLL 200 is equal to n*tCK−REPD (where n is an integer greater than 0).

The clock transfer section 214 outputs the source clock EX_CLK as the reset clock RE_CLK in response to the reset signal RST.

The pulse generation section 216 receives the replica oscillation signal REPOSC and the reset clock RE_CLK and outputs the delay amount pulse DPULSE having the pulse width corresponding to the delay amount for the delay locking of the DLL 200. More specifically, the first detection signal generator 217A generates the first detection signal DET1 which is activated in synchronization with the falling edge of the replica oscillation signal REPOSC. The second detection signal generator 217B generates the second detection signal DET2 which is activated in synchronization with the rising edge of the reset signal RE_CLK after the generation of the first detection signal DET1. The latch 218 outputs the delay amount pulse DPULSE, which is activated at the activation timing of the first detection signal DET1 and deactivated at the activation timing of the second detection signal DET2. Meanwhile, the reset signal generator 219 outputs the reset signal RST by delaying the second detection signal DET2 by a certain time. The certain time is to be equal to or longer than the time elapsing from the generation of the second detection signal DET2 until the delay line 240 delays the period limit clock LI_CLK in response to the code value CODE.

The operation of the first and second detection signal generators 217A and 217B included in the pulse generation section 216 is described in more detail. First, the operation of the first detection signal generator 217A is described. When the replica oscillation signal REPOSC becomes a logic high level, a logic low level signal is inputted by the second inverter INV2 to a first input terminal of the first AND gate AND1. Thus, the first detection signal DET1 of a logic low level is outputted. Meanwhile, since the delay amount pulse DPULSE is activated after the first detection signal DET1 changes from a logic low level to a logic high level, the delay amount pulse DPULSE maintains a logic low level. Therefore, a logic high level signal is inputted by the first inverter INV1 to a second input terminal of the first AND gate AND1. In such a state, when the replica oscillation signal REPOSC changes from a logic high level to a logic low level, a logic high level signal is inputted by the second inverter INV2 to the first input terminal of the first AND gate AND1. A logic high level signal is inputted to a third input terminal of the first AND gate AND3 for a delay time of the third inverter INV3. Therefore, since the logic high level signals are inputted to all the input terminals of the first AND gate AND1 for the delay time of the third inverter INV3 from the moment that the replica oscillation signal REPOSC changes from a logic high level to a logic low level, the first detection signal DET1 is activated to a logic high level. After the delay time of the third inverter INV3 elapses, the output signal of the third inverter INV3 has a logic low level. Thus, the first detection signal DET1 is deactivated to a logic low level. Next, the operation of the second detection signal generator 217B is described. While the first detection signal DET1 is inactive, the second AND gate AND2 receives the delay amount pulse DPULSE of a logic low level. Thus, the second detection signal DET2 of a logic low level is outputted. In such a state, when the first detection signal DET1 changes to a logic high level, the second AND gate AND2 outputs the second detection signal DET2 of a logic high level for the delay time of the fourth inverter INV4 from the moment that the reset clock RE_CLK changes from a logic low level to a logic high level. After the delay time of the fourth inverter INV4 elapses, the output signal of the fourth inverter INV4 has a logic low level. Thus, the second detection signal DET2 is deactivated to a logic low level.

Next, the operation of the delay amount coding unit 220 is described. The oscillator section 222 generates the oscillation signal OSC in response to the delay amount pulse DPULSE, and the counter section 224 counts the number of the oscillations of the oscillation signal OSC and outputs the code value CODE. That is, the oscillator section 222 generates the oscillation signal OSC during the activation period of the delay amount pulse DPULSE. The counter section 224 counts the number of the oscillations of the oscillation signal OSC, codes the count value, and outputs the code value CODE to the delay line 240.

Meanwhile, the source clock EX_CLK transferred to the delay line 240 is controlled to toggle only during the period determined by the clock control unit 230, which is described with reference to FIGS. 10 and 11.

Referring to FIG. 10, when the read command signal RD_CMD is activated in such a state that the source clock EX_CLK is continuously inputted, the operation control signal OP_CMD derived from the read command signal RD_CMD is also activated.

The period setting section 232 divides the source clock EX_CLK in response to the activated operation control signal OP_CMD. Referring to FIG. 11, the first divider 232A divides the period of the source clock EX_CLK by two in response to the activated operation control signal OP_CMD, and outputs a first division clock DI_CLK1 to the second divider 232B. The second divider 232B again divides the period of the first division signal DI_CLK1 of the first divider 232A by two in response to the activated operation control signal OP_CMD, and outputs a second division clock DI_CLK2 to the third divider 232C. The third divider 232C again divides the period the second division signal DI_CLK2 of the second divider 232B by two in response to the activated operation control signal OP_CMD, and outputs a third division clock DI_CLK3 to the fourth divider 232D. The fourth divider 232D again divides the period of the third division signal DI_CLK3 of the third divider 232C by two in response to the activated operation control signal OP_CMD, and outputs an output signal to the clock limit section 234. Therefore, the output signal of the fourth divider 232D is outputted as the period setting signal CO_CMD, which is generated by dividing the period of the source clock EX_CLK by sixteen. Although it has been described above that the first to fourth dividers 232A to 232D are provided in order to divide the source clock EX_CLK, the invention is not limited thereto. The period of the source clock EX_CLK may be divided by providing various numbers of dividers, according to demand. For example, in the case of DDR3, when a burst length is 8, 4 clock cycles (4 tCK) are needed and when a CAS latency is 15, 15 clock cycles (15 tCK) are needed. Therefore, in this case, a total time of at least 19 cycles (19 tCK) of the source clock EX_CLK is to be secured. Therefore, the period setting signal CO_CMD may be activated for 32 cycles of the source clock EX_CLK (32 tCK). In this case, six dividers (2^6=64) are demanded. The period setting section 232 divides the period of the source clock EX_CLK by sixty four and outputs the period setting signal CO_CMD.

Referring again to FIG. 10, the clock limit section 234 activates the toggling limit signal LI_CMD in synchronization with the source clock EX_CLK according to the activated read command signal RD_CMD, and deactivates the toggling limit signal LI_CMD in synchronization with the source clock EX_CLK according to the period setting signal CO_CMD transferred from the period setting unit 232. More specifically, when the read command signal RD_CMD is at a logic low level, the period setting signal CO_CMD is also at a logic low level. Thus, the clock limit section 234 outputs the toggling limit signal LI_CMD of a logic low level through the latch (including, for example, NAND2 and NAND3). In such a state, when the read command signal RD_CMD changes from a logic low level to a logic high level, the latch outputs/ maintains the toggling limit signal LI_CMD of a logic high level in synchronization with the source clock EX_CLK. When the period setting signal CO_CMD, which is activated according to the activated read command signal RD_CMD, is deactivated, the latch outputs/maintains the toggling limit signal LI_CMD of a logic low level in synchronization with the source clock EX_CLK.

The output section 236 outputs the source clock EX_CLK in synchronization with the toggling limit signal LI_CMD. In other words, the output section 236 outputs the period limit clock LI_CLK, which toggles only during the activation period of the toggling limit signal LI_CMD.

Meanwhile, the delay line 240 outputs the final internal clock DLL_CLK of the DLL 200 by delaying the period limit clock LI_CLK applied through the clock control unit 230 in response to the code value CODE applied from the delay amount coding unit 220. The delay line 240 receives the period limit clock LI_CLK, which toggles only during the period determined by the clock control unit 230, instead of the source clock EX_CLK, which toggles continuously. Therefore, current consumption of the delay line 240 may be reduced.

In accordance with the exemplary embodiments of the present invention, the open loop type DLL is provided to reduce the delay locking time, which can improve the performance of the semiconductor integrated circuit. Furthermore, the source clock applied to the delay line is controlled with respect to the toggling period, which can prevent unnecessary current consumption.

While the present invention has been described with respect to the specific embodiments, it will be apparent to those skilled in the art that various changes and modifications may be made without departing from the spirit and scope of the invention as defined in the following claims.

What is claimed is:

1. An open loop type delay locked loop comprising:
    a delay amount pulse generation unit configured to generate a delay amount pulse having a pulse width corresponding to a delay amount for delay locking a clock signal;
    a delay amount coding unit configured to output a code value by coding the delay amount in response to the delay amount pulse;
    a clock control unit configured to adjust a toggling period of a clock signal in response to a control signal; and
    a delay line configured to delay an adjusted clock signal outputted from the clock control unit in response to the code value,
    wherein the delay amount pulse generation unit comprise:
        a replica delay oscillator section configured to output a replica oscillation signal having a pulse width corresponding to a modeled delay amount in response to a reset signal;
        a clock transfer section configured to receive the clock signal and output the received clock signal in response to the reset signal; and
        a pulse generation section configured to generate a delay amount pulse having a pulse width corresponding to a delay amount for delay locking the clock signal in response to the replica oscillation signal and an output of the clock transfer section.

2. The open loop type delay locked loop of claim 1, wherein the delay amount coding unit comprises:
    an oscillator section configured to generate an oscillation signal in response to the delay amount pulse; and
    a counter section configured to count a number of oscillations of the oscillation signal and output the code value by coding the counted number of the oscillations of the oscillation signal.

3. The open loop type delay locked loop of claim 1, wherein the control signal comprises a read command signal.

4. The open loop type delay locked loop of claim 1, wherein the clock control unit is configured to limit the toggling period of the clock signal to a period determined in response to the control signal.

5. An open loop type delay locked loop comprising:
    a replica delay oscillator section configured to output a replica oscillation signal having a pulse width corresponding to a modeled delay amount in response to a reset signal;
    a clock transfer section configured to receive a clock signal and output the received clock signal in response to the reset signal;
    a pulse generation section configured to generate a delay amount pulse having a pulse width corresponding to a delay amount for delay locking the clock signal in response to the replica oscillation signal and an output of the clock transfer section;
    a delay amount coding unit configured to output a code value by coding the delay amount in response to the delay amount pulse;
    a clock toggling control unit configured to generate a toggling control signal for setting a toggling period of the clock signal in response to a control signal;
    an output unit configured to adjust the toggling period of the clock signal to a certain period in response to the toggling control signal and output a period limit clock; and
    a delay line configured to delay the period limit clock in response to the code value.

6. The open loop type delay locked loop of claim 5, wherein the delay amount coding unit comprises:
    an oscillator section configured to generate an oscillation signal in response to the delay amount pulse; and
    a counter section configured to count a number of oscillations of the oscillation signal and output the code value by coding the counted number of the oscillations of the oscillation signal.

7. The open loop type delay locked loop of claim 5, wherein the pulse generation section comprises:
    a first detection signal generator configured to detect an edge of the replica oscillation signal corresponding to a rising edge of the delay amount pulse and output a first detection signal;
    a second detection signal generator configured to detect an edge of the clock signal corresponding to a falling edge of the delay amount pulse and output a second detection signal; and
    a latch configured to generate the delay amount pulse in response to the first detection signal and the second detection signal.

8. The open loop type delay locked loop of claim 7, wherein the pulse generation section further comprises a reset signal generator configured to delay the second detection signal by a certain time and generate the reset signal.

9. The open loop type delay locked loop of claim 8, wherein the certain time is longer than a time elapsing from the generation of the second detection signal until the period limit clock is delayed through the delay line.

10. The open loop type delay locked loop of claim 5, wherein the clock toggling control unit comprises:
    a period setting section configured to generate a period setting signal defining the toggling period of the clock signal in response to the control signal; and
    a clock limit section configured to generate the toggling control signal in response to the control signal, the clock signal, and the period setting signal.

11. The open loop type delay locked loop of claim 10, wherein the period setting section comprises:
- a signal generator configured to generate an operation control signal in response to the control signal; and
- a plurality of dividers configured to generate the period setting signal by dividing the clock signal in response to the operation control signal.

12. The open loop type delay locked loop of claim 5, wherein the output unit comprises a NAND gate configured to perform a NAND operation on the clock signal and the toggling control signal.

13. The open loop type delay locked loop of claim 5, wherein the control signal comprises a read command signal.

14. A method for operating an open loop type delay locked loop, the method comprising:
- generating a delay amount pulse having a pulse width corresponding to a delay amount for delay locking a clock signal;
- coding the delay amount to output a code value in response to the delay amount pulse;
- dividing the period of the clock signal by a certain number in response to a first control signal to generate a second control signal;
- generating a third control signal activated in synchronization with a clock signal depending on the first control signal, and deactivated in synchronization with the clock signal depending on the second control signal;
- adjusting a toggling period of the clock signal in response to the third control signal to output an adjusted clock signal; and
- delaying the adjusted clock signal by the delay amount in response to the code value, wherein the generating of the delay amount pulse comprises:
- outputting a replica oscillation signal having a pulse width corresponding to a modeled delay amount in response to a reset signal;
- receiving the clock signal and outputting a received clock signal in response to the reset signal; and
- generating a delay amount pulse having a pulse width corresponding to a delay amount for delay locking the clock signal in response to the replica oscillation signal and the received clock signal.

15. The method of claim 14, wherein the first control signal comprises a read command signal.

16. The method of claim 14, wherein the adjusting of the toggling period of the clock signal comprises outputting the clock signal during an activation period of the third control signal.

* * * * *